(12) United States Patent
Miyamoto et al.

(10) Patent No.: US 10,998,162 B2
(45) Date of Patent: May 4, 2021

(54) CHARGED-PARTICLE BEAM APPARATUS, CHARGED-PARTICLE BEAM WRITING APPARATUS, AND CHARGED-PARTICLE BEAM CONTROLLING METHOD

(71) Applicant: NUFLARE TECHNOLOGY, INC., Yokohama (JP)

(72) Inventors: Nobuo Miyamoto, Yokohama (JP); Munehiro Ogasawara, Hiratsuka (JP)

(73) Assignee: NUFLARE TECHNOLOGY, INC., Yokohama (JP)

( * ) Notice: Subject to any disclaimer, the term of this patent is extended or adjusted under 35 U.S.C. 154(b) by 430 days.

(21) Appl. No.: 16/126,105

(22) Filed: Sep. 10, 2018

(65) Prior Publication Data
US 2019/0080879 A1    Mar. 14, 2019

(30) Foreign Application Priority Data
Sep. 11, 2017    (JP) .............................. JP2017-174119

(51) Int. Cl.
*H01J 37/07*    (2006.01)
*H01J 37/09*    (2006.01)
(Continued)

(52) U.S. Cl.
CPC ............ *H01J 37/07* (2013.01); *H01J 37/063* (2013.01); *H01J 37/09* (2013.01);
(Continued)

(58) Field of Classification Search
CPC ...... H01J 37/065; H01J 37/241; H01J 37/143; H01J 37/28; H01J 2237/141; H01J 2237/3175
See application file for complete search history.

(56) References Cited

U.S. PATENT DOCUMENTS

| 5,854,490 A | 12/1998 | Ooaeh et al. |
| 2005/0011861 A1* | 1/2005 | Choo ..................... C23C 16/26 216/62 |
| 2016/0163500 A1* | 6/2016 | Li ........................ H01J 37/143 250/310 |

FOREIGN PATENT DOCUMENTS

| JP | 53-134298 A | 11/1978 |
| JP | 9-260237 A | 10/1997 |

(Continued)

OTHER PUBLICATIONS

Notice of Reasons for Refusal dated Jul. 31, 2020 in Japanese Patent Application No. 2017-174119 (with English machine translation), 6 pages.

*Primary Examiner* — David E Smith
*Assistant Examiner* — Hsien C Tsai
(74) *Attorney, Agent, or Firm* — Oblon, McClelland, Maier & Neustadt, L.L.P.

(57) ABSTRACT

A charged-particle beam apparatus is provided with a cathode to emit charged particle beams, an anode to propagate the charged particle beams emitted from the cathode in a sample surface direction, an aperture to propagate a charged particle beam passing through an opening at a predetermined position and of a predetermined shape, among the charged particle beams passing through the anode, in the sample surface direction, and a first electrode that is disposed between the anode and the aperture, and is set at a first electric potential of a polarity repelling a polarity of an ion generated due to collision of a charged particle beam.

16 Claims, 4 Drawing Sheets

(51) Int. Cl.
*H01J 37/063* (2006.01)
*H01J 37/317* (2006.01)

(52) U.S. Cl.
CPC ..... *H01J 37/3174* (2013.01); *H01J 2237/028* (2013.01); *H01J 2237/0213* (2013.01); *H01J 2237/061* (2013.01)

(56) References Cited

FOREIGN PATENT DOCUMENTS

| | | |
|---|---|---|
| JP | 2000-268754 | 9/2000 |
| JP | 2001-312986 | 11/2001 |
| JP | 2004-253395 | 9/2004 |
| JP | 2007-257969 | 10/2007 |
| JP | 2010-251338 | 11/2010 |
| JP | 4644617 | 3/2011 |
| JP | 5470194 | 4/2014 |
| JP | 2014-89953 | 5/2014 |

* cited by examiner

CHARGED-PARTICLE BEAM APPARATUS, CHARGED-PARTICLE BEAM WRITING APPARATUS, AND CHARGED-PARTICLE BEAM CONTROLLING METHOD

CROSS REFERENCE TO RELATED APPLICATIONS

This application is based upon and claims the benefit of priority from the prior Japanese Patent Application No. 2017-174119, filed on Sep. 11, 2017, the entire contents of which are incorporated herein by reference.

FIELD

Embodiments relate to a charged-particle beam apparatus, a charged-particle beam writing apparatus, and a charged-particle beam controlling method.

BACKGROUND

A writing apparatus using a charged particle beam such as an electron beam is used in a highly-integrated semiconductor fabrication process and the like, because of its intrinsically excellent resolution performance. In this type of writing apparatus, the charged particle beam is irradiated to a sample surface to form a pattern on the sample surface. In the pattern formation, an irradiation time to irradiate the charged particle beam to the sample surface becomes shorter as the current density on the sample surface is higher, thereby improving a writing throughput.

In order to have higher current density on the sample surface, the charged particle beam has to be heated to a high temperature. However, when a cathode is set at a high temperature, evaporation of a cathode material is accelerated, so that the cathode tip shape is changed during writing, thereby shortening the cathode's lifetime.

As explained above, although when the writing throughput is improved, the cathode's lifetime tends to be shortened, there is another factor for shortening the cathode's lifetime. When an electron beam collides with a current limiting aperture and the like, a gas is discharged and is ionized by secondary electrons, scattering electrons, etc., and the ions collide with the cathode, thereby accelerating the cathode's exhaustion.

DETAILED DESCRIPTION

A charged-particle beam apparatus according to the present embodiment is provided with a cathode to emit charged particle beams, an anode to propagate the charged particle beams emitted from the cathode in a sample surface direction, an aperture to propagate a charged particle beam passing through an opening at a predetermined position and of a predetermined shape, among the charged particle beams passing through the anode, in the sample surface direction, and a first electrode that is disposed between the anode and the aperture, and is set at a first electric potential of a polarity repelling a polarity of an ion generated due to collision of a charged particle beam.

Hereinafter, an embodiment of the present disclosure will be explained with reference to the drawings. In the accompanying drawings of the present specification, for simplicity in drawings and easy understanding, the scale, the ratio of height to width, etc. are modified to be exaggerated from those of actual ones.

In the following, as an example of a charged-particle beam apparatus, an electron beam writing apparatus will mainly be explained. However, the charged-particle beam apparatus according to the present embodiment is not necessarily limited to the electron beam writing apparatus, but is applicable to an inspection apparatus to inspect a written pattern, and the like.

Figure 1:
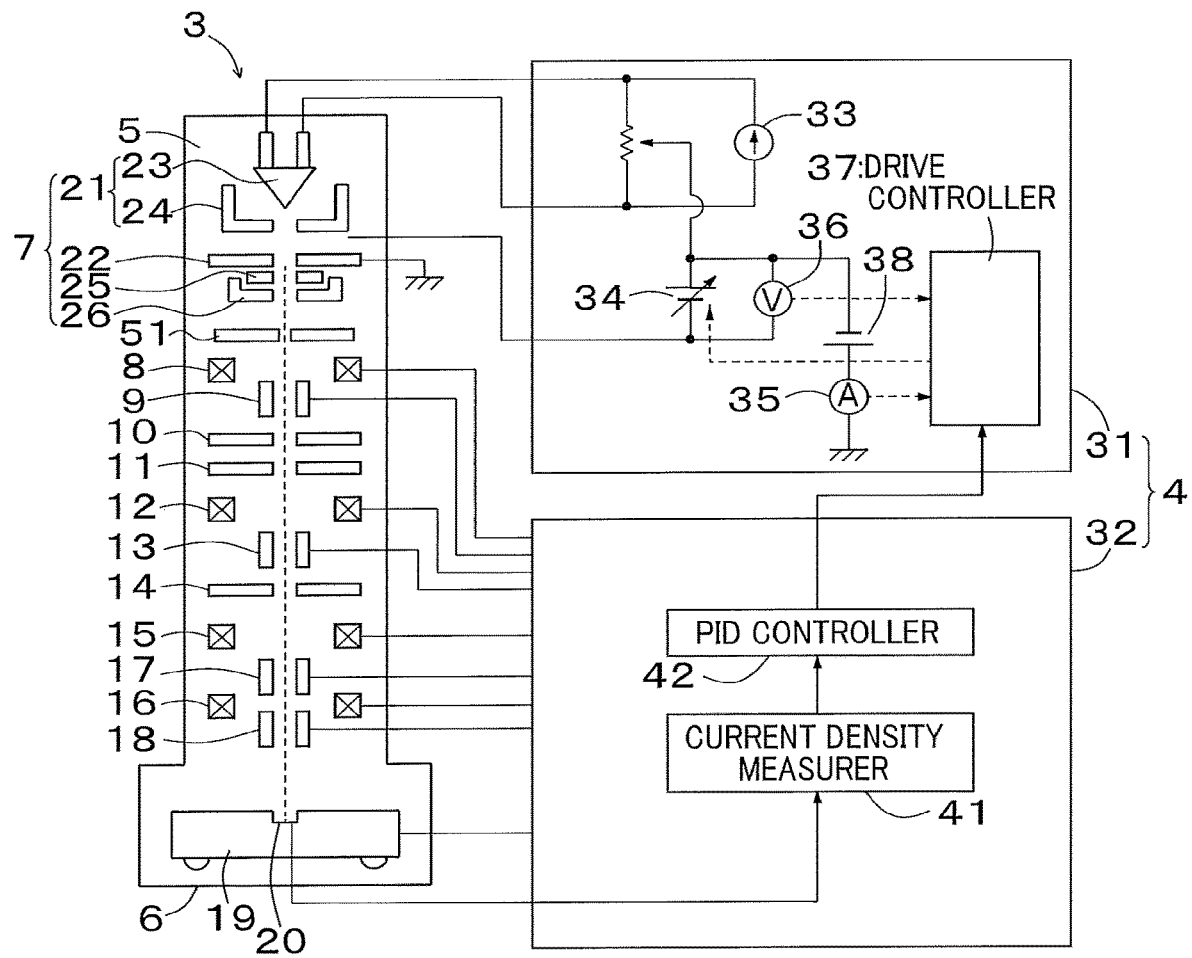
FIG. 1 is a diagrammatic block diagram of a charged-particle beam apparatus 1 according to an embodiment.

FIG. 1 is a diagrammatic block diagram of a charged-particle beam apparatus 1 according to an embodiment. The charged-particle beam apparatus 1 of FIG. 1 is practically an electron beam writing apparatus 2. The charged-particle beam apparatus 1 of FIG. 1 is provided with a writer 3 and a controller 4. The writer 3 writes a desired pattern on a sample. The controller 4 controls the writer 3.

The writer 3 has an electron lens barrel 5 and a writing room 6. Inside the electron lens barrel 5, an electron gun 7, a current limiting aperture 51, an illumination lens 8, a blanking deflector 9, a blanking aperture 10, a first shaping aperture 11, a shaping lens 12, a shaping deflector 13, a second shaping aperture 14, a reducing lens 15, an objective lens 16, a sub-deflector 17, and a main deflector 18 are provided. Inside the writing room 6, a movably-arranged X-Y stage 19 is provided. The X-Y stage 19 is provided with a beam absorbing electrode (Faraday cup) 20 for measuring a current of an electron beam to be irradiated. On the X-Y stage 19, a sample that is a writing target is placed. The sample is, for example, an exposure masking substrate for transferring a pattern onto a semiconductor wafer. By using the semiconductor wafer as the sample, a pattern may be directly written on the semiconductor wafer.

The electron gun 7 has a cathode 21, an anode 22, and a retarding electrode 25. The cathode 21 has an emitter 23 and a Wehnelt electrode 24. The anode 22 is grounded. An accelerating voltage of −50 kilovolts is applied between the anode electrode 22 and the Wehnelt electrode 24.

The retarding electrode 25 is disposed closer to the current limiting aperture 51 than the anode 22 is. In other words, the retarding electrode 25 is provided between the anode 22 and the current limiting aperture 51. The retarding electrode 25 is, as described later, provided to prevent ions 30 generated by collision of an electron beam with the current limiting aperture 51 from being pulled to the cathode 21 side.

The current limiting aperture 51 is provided to restrict the scattering of an electron beam that has passed through the anode 22. The electron beam that has passed through the anode 22 passes through an opening of the current limiting aperture 51 to be guided to the blanking deflector 9.

The controller 4 has an electron-gun power supply 31 and a write controller 32. The electron-gun power supply 31 has a constant current source 33, a variable voltage source 34, an ammeter 35, a voltmeter 36, and a drive controller 37. The constant current source 33 feeds a predetermined heating current to both electrodes of the emitter 23. The variable voltage source 34 applies a predetermined bias voltage (Wehnelt voltage) between an intermediate voltage node of the both electrodes of the emitter 23 and the Wehnelt electrode 24. To one end of the variable voltage source 34, the ammeter 35 is connected via a D.C. voltage source 38. The ammeter 35 measures an emission current flowing through the cathode 21. To the variable voltage source 34, the voltmeter 36 is connected in parallel. The voltmeter 36 measures the above-described bias voltage (Wehnelt voltage). The drive controller 37 monitors measurement results of the ammeter 35 and the voltmeter 36, and also controls the variable voltage source 34 based on an output signal of the write controller 32.

The write controller 32 has a current density measurer 41 and a PID controller 42. The current density measurer 41 measures current density on a sample surface. The PID controller 42 calculates a target value of the emission current based on the current density on the sample surface measured by the current density measurer 41. The calculated target value is sent to the drive controller 37. The drive controller 37 controls the variable voltage source 34 based on the target value received from the PID controller 42. In more specifically, the drive controller 37 performs feedback control of the bias voltage based on the target value.

Subsequently, the operations inside the electron lens barrel 5 and the writing room 6 of FIG. 1 will be explained. An electron beam emitted from the electron gun 7 illuminates the entire first shaping aperture 11 by the illumination lens 8. The first shaping aperture 11 is provided with a rectangular hole. Therefore, the electron beam is shaped into a rectangular-shape first aperture image by the first shaping aperture 11. The electron beam of the first aperture image that has passed through the first shaping aperture 11 is projected onto the second shaping aperture 14 by the shaping lens 12. The position of the first aperture image on the second shaping aperture 14 is controlled by deflection control of the shaping deflector 13, so that the beam shape and size can be varied. As a result, the electron beam is shaped. An electron beam of a second aperture image that has passed through the second shaping aperture 14 is reduced by the reducing lens 15 and is focused by the objective lens 16, and is then deflected by the main deflector 18 and the sub-deflector 17. As a result, the electron beam is irradiated onto the sample's location on the continuously-moving X-Y stage 19.

When the time to irradiate the electron beam onto the sample reaches an irradiation time to irradiate the electron beam to the sample by a desired irradiation amount, blanking control is performed in such a manner that, for example, an electrostatic blanking deflector 9 deflects the electron beam and the blanking aperture 10 cuts off the electron beam so that the electron beam is not irradiated onto the sample more than necessary. In this way, the electron beam does not reach the sample's surface. A deflection voltage of the blanking deflector 9 is controlled by the write controller 32. The inside of the electron lens barrel 5 and of the writing room 6 is kept at a pressure lower than an atmospheric pressure by a not-shown vacuum pump.

Figure 2A:
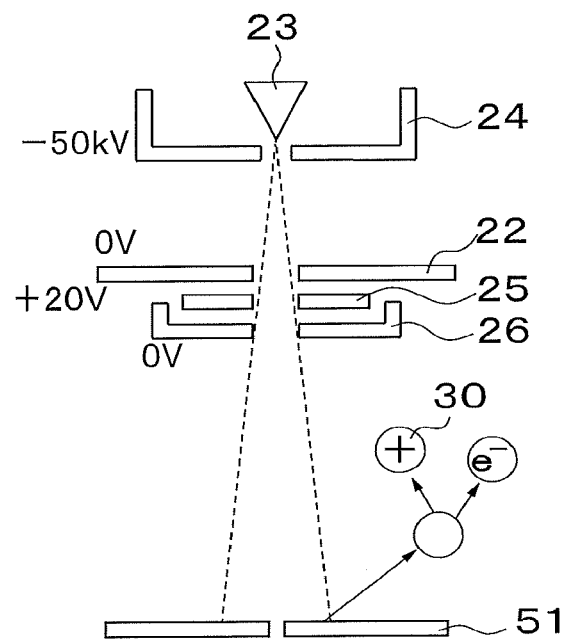
FIG. 2A is an enlarged view of an configuration from an electron gun to a current limiting aperture in the present embodiment.
Figure 2B:
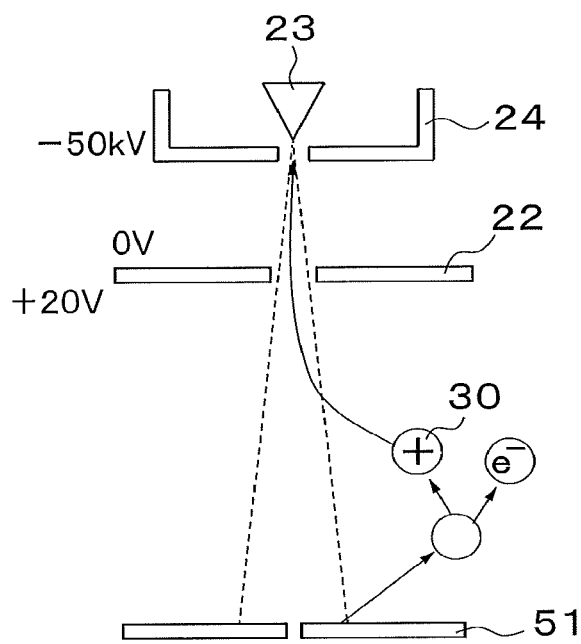
FIG. 2B is an enlarged view of an configuration from an electron gun to a current limiting aperture in a comparative example.
Figure 3:
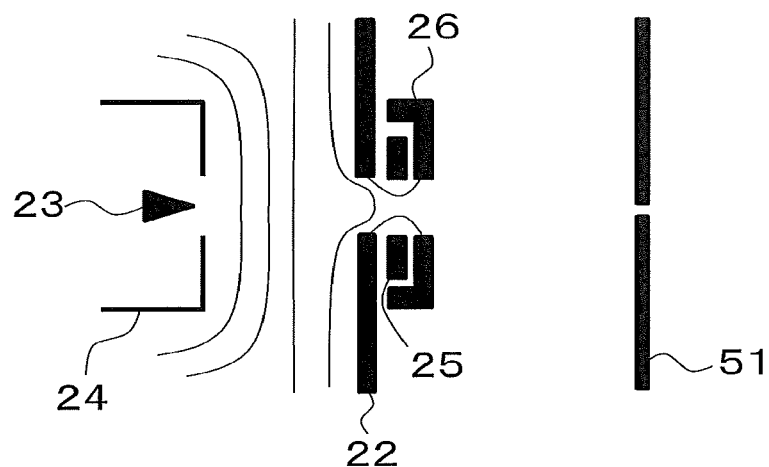
FIG. 3 is a figure schematically showing an electric field between an anode and the current limiting aperture in FIG. 2A.
Figure 4:
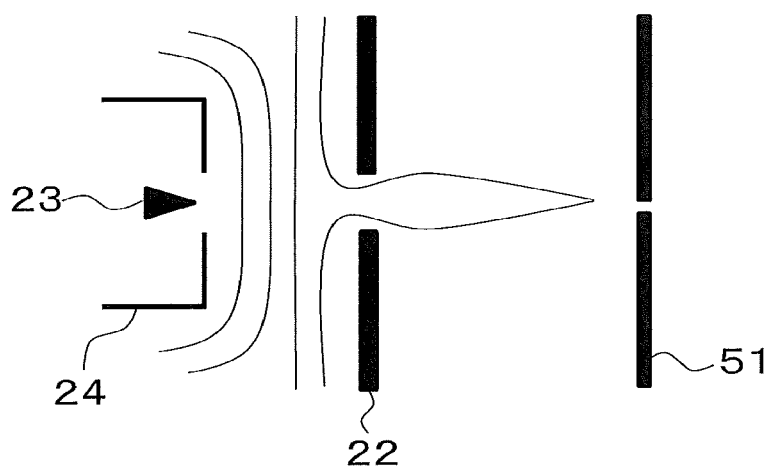
FIG. 4 is a figure schematically showing an electric field between an anode and the current limiting aperture in FIG. 2B.

FIGS. 2A and 2B are enlarged views of the configuration from the electron gun 7 to the current limiting aperture 51. Whereas FIG. 2A shows the configuration of the present embodiment, FIG. 2B shows a configuration of a comparative example. Moreover, FIG. 3 is a figure schematically showing an electric field between the anode 22 and the current limiting aperture 51 in FIG. 2A, whereas, FIG. 4 is a figure schematically showing an electric field between the anode 22 and the current limiting aperture 51 in FIG. 2B. A plurality of thin lines shown in FIGS. 3 and 4 represent equipotential lines, a vertical direction of which is the direction of the electric field.

FIG. 2B shows a comparative example having a configuration with omission of the retarding electrode 25 from the configuration of FIG. 2A. In FIGS. 2A and 2B, the electric potential of the Wehnelt electrode 24 is −50 kilovolts, the electric potential of the anode 22 is 0 volts, and the electric potential of the current limiting aperture 51 is 0 volts. Since, the anode 22 and the current limiting aperture 51 are set at a higher electric potential than the Wehnelt electrode 24, an electron beam emitted from the Wehnelt electrode 24 goes in a direction of the current limiting aperture 51 through the anode 22. Since the opening of the current limiting aperture 51 has a small diameter, many portions of the electron beam collide with the parts of the current limiting aperture 51 other than the opening. Due to this collision, a gas is generated, and also secondary electrons, scattered electrons, etc. are generated. The gas is, for example, oxygen, moisture, etc. This gas is decomposed into ions 30 by the secondary electrons, scattered electrons, etc. The ions 30 include positive ions 30 and negative ions, among which the positive ions 30 are pulled to the emitter 23 side by an accelerating electric field that is oozing as shown in FIG. 4. In other words, since an electric field is present in a wide area from the anode 22 to the place in the vicinity of the current limiting aperture 51, the positive ions 30, among the ions generated due to the collision of the electron beam with the current limiting aperture 51, are pulled to the emitter 23 side, along the electric field. Therefore, the positive ions 30 may collide with the emitter 23, thereby damaging the emitter 23.

In contrast to this, in the case of the present embodiment shown in FIG. 2A, the retarding electrode 25 is provided between the anode 22 and the current limiting aperture 51, and this retarding electrode 25 is set at a positive potential. Therefore, the positive ions 30, generated due to the collision of electron ions 30 with the current limiting aperture 51, and the retarding electrode 25 repel each other. Accordingly, the positive ions 30 are not pulled to the emitter 23 side. In this way, the positive ions 30 do not collide with the emitter 23 and hence the lifetime of the cathode 21 can be extended.

As described above, by inverting polarity of the electric potential of the retarding electrode 25 and polarity of the electric potential of the Wehnelt electrode 24, the ions 30 having an inverted polarity to the electric potential of the Wehnelt electrode 24 can be prevented from approaching the retarding electrode 25, and, as a result, the ions 30 can be prevented from being pulled to the Wehnelt electrode 24.

In relation to this, in the case of FIG. 3, since the electric field is confined between the retarding electrode 25 and a ground electrode 26, the electric field is present only between the retarding electrode 25 and the ground electrode 26, and further the electric field is in the reverse direction to that in FIG. 4. Therefore, the positive ions 30 and the electric field in this reverse direction repel each other, and hence the positive ions 30 are not pulled to the emitter 23 side.

In the present embodiment, as shown in FIG. 2A, although the ground electrode 26 set at a ground potential is disposed between the retarding electrode 25 and the current limiting aperture 51, the ground electrode 26 is not an essential part and hence may be omitted. As described later, by providing the ground electrode 26, an electric field generated by the retarding electrode 25 can be confined between the retarding electrode 25 and the ground electrode 26, and hence a higher positive-ion shielding effect can be obtained.

Moreover, although the ground electrode 26 may not always necessarily be set at the ground potential, it is desirably set at the same electric potential as the anode 22. Therefore, in the case where the anode 22 is set at electric potential other than the ground potential, it is desirable that the ground electrode 26 is also set at the same electric potential as the anode 22, and the retarding electrode 25 is set at electric potential of, for example, 20 volts higher than the electric potential of the anode 22.

Although there is a probability that negative ions are included in the ions generated due to the collision of an electron beam with the current limiting aperture 51, since the Wehnelt electrode 24 is at a negative potential, it is originally assumed that there is no possibility that the negative ions are pulled to the emitter 23 side. Therefore, it is only enough to take measures to prevent the positive ions 30 from being pulled to the emitter 23 side.

Figure 5:
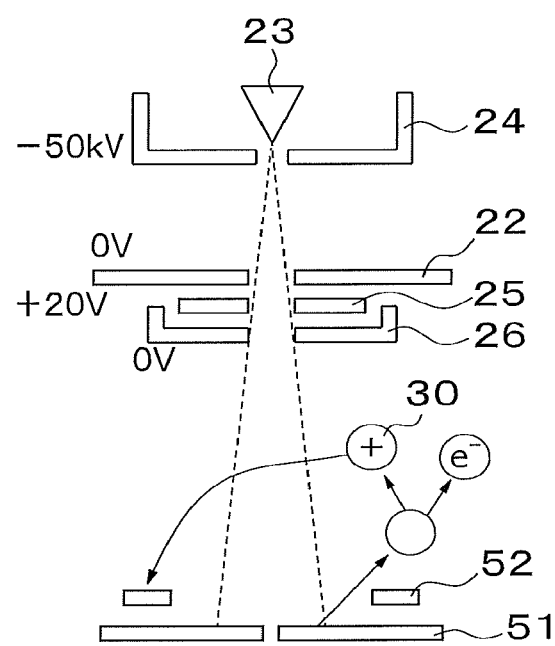
FIG. 5 is a figure showing a configuration having a positive-ion capture electrode in addition to those shown in FIG. 2A.

FIG. 5 shows a configuration having a positive-ion capture electrode 52 in addition to those shown in FIG. 2A. The positive-ion capture electrode 52 is disposed, for example, between the retarding electrode 25 and the current limiting aperture 51. In a more specific example, the positive-ion capture electrode 52 is disposed closer to the current limiting aperture 51 between the retarding electrode 25 and the current limiting aperture 51.

FIG. 5 shows an example in which a ring-like positive-ion capture electrode 52 is provided near the current limiting aperture 51. The installation location and shape of the positive-ion capture electrode 52 can be freely decided. Moreover, a plurality of positive-ion capture electrodes 52 may be arranged near the retarding electrode 25.

The positive-ion capture electrode 52 is set to an electric potential that is the inverse of the electric potential of the retarding electrode 25. FIG. 5 shows an example in which the positive-ion capture electrode 52 is set at a negative potential (for example, −20 volts). Among the ions 30 generated due to the collision of an electron beam with the current limiting aperture 51, the positive ions 30 are pulled to the positive-ion capture electrode 52 because of the negative potential at which the positive-ion capture electrode 52 is set, and, as a result, the positive ions 30 are not pulled to the emitter 23 side.

It is a precondition in the present embodiment that the positive-ion capture electrode 52 is used with the retarding electrode 25. Accordingly, the positive ions 30 which cannot be prevented only by the retarding electrode 25 from being pulled to the emitter 23 side can be captured by the positive-ion capture electrode 52. Therefore, the number of positive ions 30 pulled to the emitter 23 side can be reduced further, so that the damage of the cathode 21 due to the collision of the positive ions 30 can be prevented more certainly.

As described above, in the present embodiment, the retarding electrode 25 is provided between the anode 22 and the current limiting aperture 51, and the retarding electrode 25 is set at a positive potential. Therefore, the positive ions 30, which are generated due to the collision of the electron beam with the current limiting aperture 51, and the retarding electrode 25 expel each other, and hence the positive ions 30 are not pulled to the emitter 23 side. Accordingly, the positive ions 30 generated due to the collision of the electron beam with the current limiting aperture 51 are not pulled to the cathode 21, so that the damage of the cathode 21 due to the collision of the positive ions 30 can be prevented, and hence the lifetime of the cathode 21 can be extended longer.

Moreover, by providing the ground electrode 26 between the retarding electrode 25 and the current limiting aperture 51, and by setting the ground electrode 26 at the same electric potential as the anode 22, the electric field generated by the retarding electrode 25 can be confined between the retarding electrode 25 and the ground electrode 26, so that the retarding electrode 25 does not prevent the propagation of an essential electron beam.

Furthermore, by providing the positive-ion capture electrode 52 between the retarding electrode 25 and the current limiting aperture 51, and by setting the positive-ion capture electrode 52 at the negative potential, at least part of the positive ions 30, which cannot be prevented only by the retarding electrode 25 from heading for the emitter 23 side, can be captured by the positive-ion capture electrode 52. Therefore, the frequency of collision of the positive ions 30 with the cathode 21 can further be reduced, so that the lifetime of the cathode 21 can further be extended.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A charged-particle beam apparatus comprising:
   a cathode to emit charged particle beams;
   an anode to propagate the charged particle beams emitted from the cathode in a sample surface direction;
   an aperture to propagate a charged particle beam passing through an opening at a predetermined position and of a predetermined shape, among the charged particle beams passing through the anode, in the sample surface direction; and
   a first electrode that is disposed between the anode and the aperture, and is set at a first electric potential of a polarity repelling a polarity of an ion generated due to collision of a charged particle beam.

2. The charged-particle beam apparatus of claim 1, wherein the first electric potential has an inverse polarity to an electric potential of the cathode.

3. The charged-particle beam apparatus of claim 1 further comprising a second electrode disposed closer to a sample surface side than the first electrode and opposite to the sample surface side, the second electrode facing the first electrode, and the second electrode being set at a same electric potential as the anode.

4. The charged-particle beam apparatus of claim 1 further comprising a third electrode that captures the ion and is disposed around the aperture.

5. The charged-particle beam apparatus of claim 4, wherein the third electrode is disposed between the aperture and the first electrode.

6. The charged-particle beam apparatus of claim 4, wherein the third electrode is set at a second electric potential having an inverse polarity to the electric potential of the first electrode.

7. The charged-particle beam apparatus of claim 3, wherein a direction of an electric field between the first electrode and the second electrode is a reverse direction to a direction of an electric field between the first electrode and the anode.

8. The charged-particle beam apparatus of claim 1, wherein the aperture is a current limiting aperture disposed between the anode and an illumination lens.

9. A charged-particle beam writing apparatus comprising:
a cathode to emit charged particle beams;
an anode to propagate the charged particle beams emitted from the cathode in a sample surface direction;
an aperture to propagate a charged particle beam passing through an opening at a predetermined position and of a predetermined shape, among the charged particle beams passing through the anode, in the sample surface direction;
a first electrode that is disposed between the anode and the aperture, and is set at a first electric potential of a polarity repelling a polarity of an ion generated due to collision of a charged particle beam; and
a write controller to irradiate a charged particle beam having passed through the aperture onto a sample surface to perform writing.

10. The charged-particle beam writing apparatus of claim 9, wherein the first electric potential has an inverse polarity to an electric potential of the cathode.

11. The charged-particle beam writing apparatus of claim 9 further comprising a second electrode disposed closer to a sample surface side than the first electrode to the sample surface side, the second electrode facing the first electrode, and the second electrode being set at a same electric potential as the anode.

12. The charged-particle beam writing apparatus of claim 9 further comprising a third electrode to capture the ion, the third electrode being disposed around the aperture.

13. The charged-particle beam writing apparatus of claim 12, wherein the third electrode is disposed between the aperture and the first electrode.

14. The charged-particle beam writing apparatus of claim 12, wherein the third electrode is set at a second electric potential having an inverse polarity to the electric potential of the first electrode.

15. The charged-particle beam writing apparatus of claim 11, wherein a direction of an electric field between the first electrode and the second electrode is a reverse direction to a direction of an electric field between the first electrode and the anode.

16. The charged-particle beam writing apparatus of claim 9, wherein the aperture is a current limiting aperture disposed between the anode and an illumination lens.

* * * * *